(12) United States Patent
Singh et al.

(10) Patent No.: US 10,679,714 B2
(45) Date of Patent: Jun. 9, 2020

(54) ROM CELL WITH TRANSISTOR BODY BIAS CONTROL CIRCUIT

(71) Applicant: NXP B.V., Eindhoven (NL)

(72) Inventors: Jainendra Singh, Bangalore (IN); Jwalant Kumar Mishra, Bangalore (IN); Patrick Van de Steeg, Oss (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/399,939

(22) Filed: Apr. 30, 2019

(65) Prior Publication Data

US 2020/0082894 A1 Mar. 12, 2020

Related U.S. Application Data

(63) Continuation-in-part of application No. 16/129,718, filed on Sep. 12, 2018.

(51) Int. Cl.
| | |
|---|---|
| *G11C 8/08* | (2006.01) |
| *G11C 17/08* | (2006.01) |
| *G11C 11/412* | (2006.01) |
| *G11C 11/417* | (2006.01) |

(52) U.S. Cl.
CPC ............. *G11C 17/08* (2013.01); *G11C 8/08* (2013.01); *G11C 11/412* (2013.01); *G11C 11/417* (2013.01)

(58) Field of Classification Search
CPC .................................. G11C 8/08; G11C 16/10
USPC ........................................ 365/189.09, 185.24
See application file for complete search history.

(56) References Cited

U.S. PATENT DOCUMENTS

| | | | | |
|---|---|---|---|---|
| 4,912,674 A | * | 3/1990 | Matsumoto | G11C 17/126 257/E27.102 |
| 5,935,400 A | * | 8/1999 | Takami | G01N 27/4067 204/406 |
| 6,163,048 A | * | 12/2000 | Hirose | G11C 16/0483 257/315 |
| 6,484,265 B2 | | 11/2002 | Borkar et al. | |
| 6,593,799 B2 | | 7/2003 | De et al. | |
| 6,762,474 B1 | | 7/2004 | Mills, Jr. | |
| 7,681,628 B2 | | 3/2010 | Joshi et al. | |
| 7,715,246 B1 | * | 5/2010 | Kim | G11C 7/18 365/189.05 |
| 7,928,769 B1 | * | 4/2011 | Huang | H03K 19/0013 326/93 |
| 8,004,907 B2 | | 8/2011 | Russell et al. | |
| 8,018,780 B2 | | 9/2011 | Houston et al. | |
| 8,902,667 B2 | * | 12/2014 | Mu | G11C 16/3418 365/185.22 |
| 9,478,303 B1 | * | 10/2016 | Parker | G11C 16/3418 |
| 9,583,178 B2 | | 2/2017 | Jung et al. | |
| 9,818,460 B2 | | 11/2017 | Kolar et al. | |

(Continued)

*Primary Examiner* — Michael T Tran

(57) ABSTRACT

A read-only memory (ROM) includes ROM cells and a bias control circuit for biasing the ROM cells. Each ROM cell includes a set of transistors. The bias control circuit is connected to body terminals of the transistors of each ROM cell to provide a bias voltage. The bias voltage, which is temperature-dependent, is generated based on junction leakages at the body terminals of the transistors. The bias control circuit controls threshold voltages of the transistors using the bias voltage. The use of a temperature-dependent bias voltage to bias the body terminals of the transistors allows for a relatively constant read margin for each ROM cell.

19 Claims, 5 Drawing Sheets

(56) References Cited

U.S. PATENT DOCUMENTS

| | | | |
|---|---|---|---|
| 9,865,333 B2 | 1/2018 | Dhori et al. | |
| 9,875,788 B2 | 1/2018 | Jung | |
| 9,881,682 B1* | 1/2018 | Tang | G11C 16/3427 |
| 10,115,471 B1* | 10/2018 | Yang | G11C 16/30 |
| 2004/0109344 A1* | 6/2004 | Yamauchi | G11C 7/12 |
| | | | 365/154 |
| 2005/0162951 A1* | 7/2005 | Dudeck | G11C 7/12 |
| | | | 365/203 |
| 2007/0079204 A1* | 4/2007 | Ong | G01R 31/31928 |
| | | | 714/738 |
| 2008/0298155 A1* | 12/2008 | Miyako | G11C 7/12 |
| | | | 365/226 |
| 2009/0141580 A1* | 6/2009 | Evans | G11C 8/08 |
| | | | 365/230.06 |
| 2010/0074028 A1* | 3/2010 | Hirose | G11O 5/145 |
| | | | 365/185.29 |
| 2010/0329054 A1* | 12/2010 | Azimi | G11O 5/147 |
| | | | 365/201 |
| 2011/0013443 A1* | 1/2011 | Lee | G11C 16/0425 |
| | | | 365/104 |
| 2011/0251819 A1* | 10/2011 | Ong | G01R 31/31928 |
| | | | 702/120 |
| 2012/0327725 A1* | 12/2012 | Clark | G11C 11/412 |
| | | | 365/189.011 |
| 2013/0058177 A1* | 3/2013 | Seshadri | G11C 29/50 |
| | | | 365/201 |
| 2013/0121057 A1* | 5/2013 | Le Neel | G11C 13/0069 |
| | | | 365/148 |
| 2013/0170287 A1* | 7/2013 | Walsh | G11C 11/417 |
| | | | 365/154 |
| 2013/0272074 A1* | 10/2013 | Tanaka | G11C 16/3445 |
| | | | 365/189.07 |
| 2014/0129903 A1* | 5/2014 | Yoon | G06F 11/1048 |
| | | | 714/764 |
| 2014/0184262 A1* | 7/2014 | Poindexter | G01R 31/2853 |
| | | | 324/759.03 |
| 2014/0293723 A1* | 10/2014 | Grover | G11C 7/06 |
| | | | 365/210.1 |
| 2015/0085566 A1* | 3/2015 | Jain | G11C 8/08 |
| | | | 365/154 |
| 2015/0213844 A1* | 7/2015 | Nguyen | G11O 5/145 |
| | | | 365/226 |
| 2016/0042797 A1* | 2/2016 | Kim | G11C 16/26 |
| | | | 714/764 |
| 2017/0084316 A1* | 3/2017 | Kulkarni | G11C 7/12 |
| 2017/0125128 A1* | 5/2017 | Lee | G11C 29/1201 |
| 2018/0114583 A1* | 4/2018 | Wang | G11C 17/18 |
| 2019/0130967 A1* | 5/2019 | Danjean | G11C 11/5642 |
| 2019/0304962 A1* | 10/2019 | Prabhat | G11C 11/417 |

* cited by examiner

ROM CELL WITH TRANSISTOR BODY BIAS CONTROL CIRCUIT

CROSS-REFERENCE TO RELATED APPLICATIONS

This case is related to U.S. patent application Ser. No. 16/129,718 filed on Sep. 12, 2018 and owned by NXP. B.V.

BACKGROUND

The present invention relates generally to memory circuits, and, more particularly, to a transistor body bias control circuit for read-only memory (ROM) cells.

A semiconductor memory circuit stores data electronically. One type of memory circuit is a ROM, which is made up of an array of ROM cells. A ROM cell typically includes a set of transistors that have threshold voltages that determine a read margin (i.e., accuracy of a read operation) of the ROM cell. However, as semiconductor device sizes shrink, fluctuations in the threshold voltages increase due to random dopant fluctuation (RDF), line edge roughness (LER), and short channel effects (SCE). Further, at low operating voltages (e.g., 0.8 volts at 40 nanometer technology node), there is an additional increase in threshold voltage fluctuations. These fluctuations degrade the read margin.

The read margin of the ROM cell is further dependent on temperature, as the threshold voltage varies with temperature. For example, threshold voltages are higher at low temperatures as compared to high temperatures, so the read margin degrades at low temperatures as compared to high temperatures. Further, the higher threshold voltages at low temperatures degrade a read current of the ROM cell, especially at the low operating voltages. The degradation in the read current results in degradation in the speed of the ROM cell.

A conventional approach to reduce the read margin and operational speed degradations of the ROM cell is to reduce the threshold voltages at low temperatures. However, reduction in the threshold voltages at low temperatures reduces the threshold voltages at high temperatures, which in turn increases static leakage power of the ROM cell at high temperatures. To solve this problem, biasing techniques are used to bias the transistors in the ROM cells. The biasing techniques may be implemented with biasing circuits that include various combinations of transistors, resistors, diodes, and the like, and include generating a bias voltage that is provided to body terminals of the ROM cell transistors to control the corresponding threshold voltages. However, employing the biasing circuits consumes additional area and power. Further, the additional power increases the static leakage power.

Therefore, it would be advantageous to have a biasing technique that maintains the read margin of a ROM cell above an acceptable level over a temperature range, increases an operational speed of the ROM cell, and solves the above-mentioned problems of the conventional approaches of reducing the read margin and operational speed degradation.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
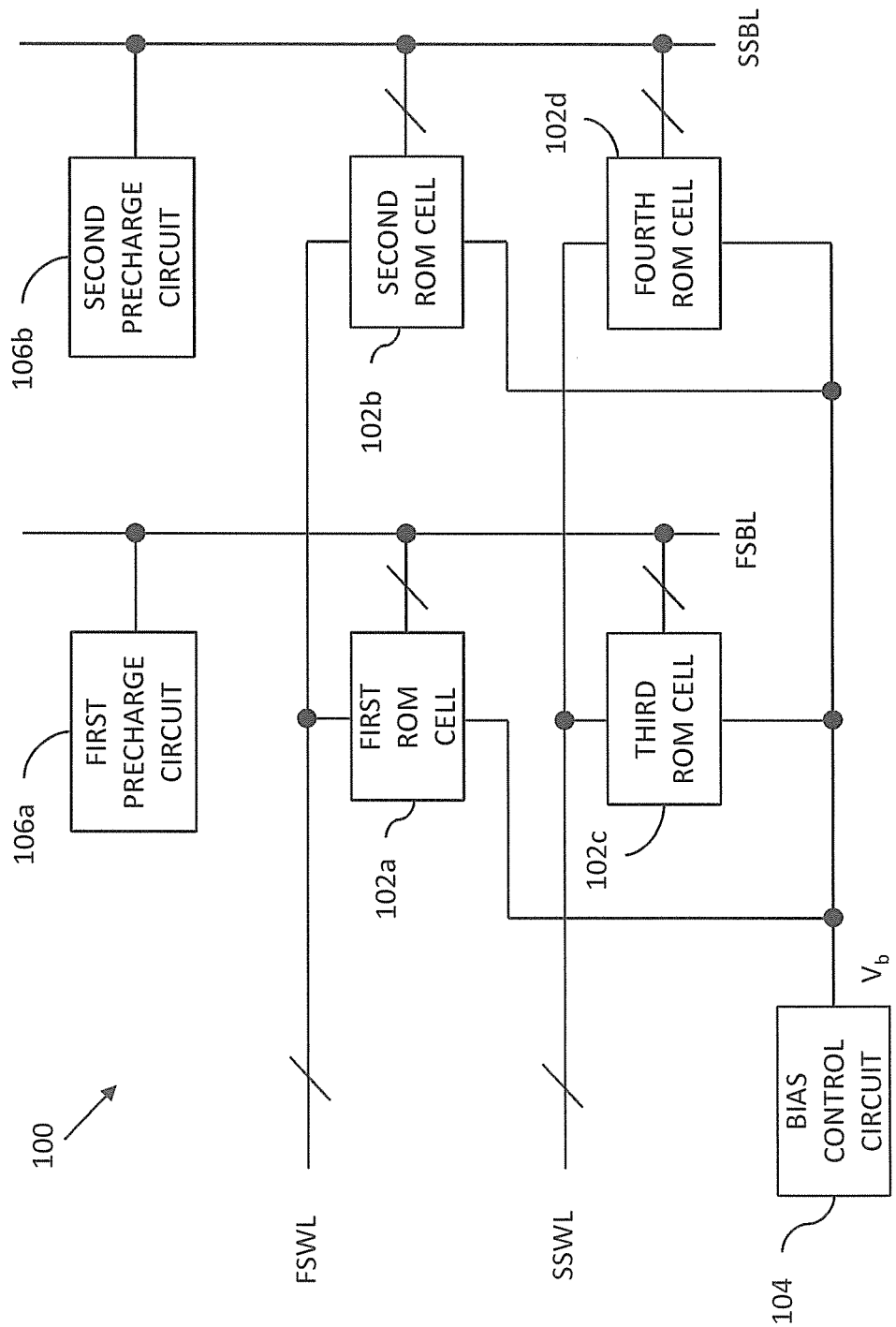
FIG. 1 is a schematic block diagram of a ROM circuit in accordance with an embodiment of the present invention.

The detailed description of the appended drawings is intended as a description of the currently preferred embodiments of the present invention and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a ROM circuit that includes a plurality of memory cells and a bias control circuit for biasing the plurality of memory cells. Each memory cell includes a set of transistors. The bias control circuit is connected to body terminals of the transistors in the set of transistors of each memory cell. The bias control circuit provides a bias voltage to control threshold voltages of the transistors of the set of transistors. The bias voltage, which is temperature-dependent, is generated based on junction leakages at the body terminals.

In another embodiment, the present invention provides a ROM circuit that includes a ROM cell and a bias control circuit for biasing the ROM cell. The ROM cell includes a set of transistors. The bias control circuit is connected to body terminals of the transistors of the set of transistors and provides a bias voltage to control threshold voltages of the transistors of the set of transistors. The bias voltage, which is temperature-dependent, is generated based on junction leakages at the body terminals. The ROM circuit further includes a set of word lines connected to the ROM cell such that a gate of each transistor of the set of transistors is connected to a word line of the set of word lines. The set of word lines provides a set of word line voltages to the ROM cell for controlling an operation of the ROM cell. The ROM circuit further includes a set of bit lines connected to the ROM cell. Data stored in the ROM cell is read by way of the set of bit lines, and based on the set of word line voltages.

In yet another embodiment, the present invention provides a method for biasing a ROM cell that includes a set of transistors. The method includes generating a temperature-dependent bias voltage by a bias control circuit, where the bias voltage is generated based on junction leakages at body terminals of the transistors of the set of transistors. The method further includes providing the bias voltage to the body terminals to control threshold voltages of the transistors of the set of transistors.

Various embodiments of the present invention provide ROM circuit. The ROM circuit includes a ROM cell and a bias control circuit for biasing the ROM cell. The ROM cell includes a set of transistors. The bias control circuit is connected to body terminals of the transistors of the set of transistors for providing a bias voltage to control threshold voltages of the transistors of the set of transistors. The bias voltage is generated based on junction leakages at the body terminals and is temperature-dependent. In one embodiment, the bias control circuit is a transistor-based diode. The bias control circuit regulates a read margin and an operational speed of the ROM cell by controlling the threshold voltages of transistors of the set of transistors. The ROM circuit further includes a set of word lines connected to the ROM cell such that the gates of each of the transistors of the set of transistors are connected to a word line of the set of word lines. The set of word lines provides a set of word line voltages to the ROM cell for controlling an operation of the ROM cell. The ROM circuit further includes a set of bit lines connected to the ROM cell. Data stored in the ROM cell is read by way of the set of bit lines, and based on the set of word line voltages.

The use of a transistor-based diode as a bias control circuit to generate the bias voltage ensures that the bias control circuit occupies less area than biasing circuits of conventional ROM circuits. Thus, an overall area occupied by the ROM circuit is considerably less than the area required by ROM circuits that include conventional biasing circuits. Further, as the bias control circuit controls the threshold voltages of the transistors of the set of transistors, the read margin of the ROM cell is relatively constant and is above acceptable levels, over a predetermined temperature range. As the bias voltage is temperature-dependent, reducing the threshold voltages of the transistors of the set of transistors at low temperatures does not result in reduction in the threshold voltages of the transistors at high temperatures. Thus, an improvement in the read margin at low temperatures does not increase static leakage power at high temperatures. Further, the control of the threshold voltages of the transistors ensures that the ROM cell operates at a faster speed than conventional ROM cells, especially at low temperatures.

Referring now to FIG. 1, a schematic block diagram of a ROM circuit 100 in accordance with an embodiment of the present invention is shown. The ROM circuit 100 is an electronic data storage device on an integrated circuit (IC) (not shown). The ROM circuit 100 includes first through fourth ROM cells 102a-102d (collectively referred to as "ROM cells 102"), a bias control circuit 104, and first and second precharge circuits 106a and 106b. In one embodiment, the bias control circuit 104 is a transistor-based diode. The transistor-based diode corresponds to one or more transistors connected to form a diode. The ROM circuit 100 further includes first and second sets of word lines FSWL and SSWL and first and second sets of bit lines FSBL and SSBL.

The first and second ROM cells 102a and 102b are connected to the first set of word lines FSWL for receiving a first set of word line voltages (shown in FIGS. 2A and 2B), respectively. Similarly, the third and fourth ROM cells 102c and 102d are connected to the second set of word lines SSWL for receiving a second set of word line voltages (not shown), respectively. First and second decoders (not shown) generate and provide the first and second sets of word line voltages to the first and second sets of word lines FSWL and SSWL, respectively. The first and third ROM cells 102a and 102c are further connected to the first set of bit lines FSBL. Similarly, the second and fourth ROM cells 102b and 102d are further connected to the second set of bit lines SSBL.

During a read operation of the first ROM cell 102a, the first set of bit lines FSBL in conjunction with the first set of word lines FSWL, read first data (i.e., stored data) from the first ROM cell 102a. Similarly, during a read operation of the second ROM cell 102b, the second set of bit lines SSBL in conjunction with the first set of word lines FSWL, read second data from the second ROM cell 102b.

During a read operation of the third ROM cell 102c, the first set of bit lines FSBL in conjunction with the second set of word lines SSWL read third data from the third ROM cell 102c. Similarly, during a read operation of the fourth ROM cell 102d, the second set of bit lines SSBL in conjunction with the second set of word lines SSWL read fourth data from the fourth ROM cell 102d. Each of the first through fourth data may correspond to a set of data bits including logical '0's and '1's.

The ROM cells 102 may be n-channel metal oxide semiconductor (NMOS) based ROM cells (i.e., the ROM cells 102 include NMOS transistors) or p-channel metal oxide semiconductor (PMOS) based ROM cells (i.e., the ROM cells 102 include PMOS transistors). Further, the arrangement of transistors in the ROM cells 102 may correspond to a NOR ROM configuration or a NAND ROM configuration. Thus, the ROM cells 102 may be NMOS based NOR ROM cells, NMOS based NAND ROM cells, PMOS based NOR ROM cells, or PMOS based NAND ROM cells. The first ROM cell 102a is explained in detail in conjunction with FIGS. 2A and 2B. However, it will be apparent to a person skilled in the art that the second through fourth ROM cells 102b-102d are functionally and structurally similar to the first ROM cell 102a, without deviating from the scope of the present invention.

The bias control circuit 104 is connected to the first ROM cell 102a and receives leakage currents (shown in FIGS. 2A and 2B) that are generated at body terminals of a first set of transistors (shown in FIGS. 2A and 2B) of the first ROM cell 102a. Similarly, the bias control circuit 104 is connected to the second through fourth ROM cells 102b-102d and receives leakage currents (not shown) that are generated at body terminals of respective second through fourth sets of transistors (not shown). The leakage currents correspond to junction leakages generated at the body terminals of the first through fourth sets of transistors. A junction leakage may be generated due to various short channel effects, distance between the transistors, and the like. The bias control circuit 104 generates a bias voltage $V_b$ based on the junction leakages, and provides the bias voltage $V_b$ to the ROM cells 102. The bias voltage $V_b$ is temperature-dependent, i.e., at a low temperature (e.g., −50° C.), the bias voltage $V_b$ is at a higher voltage level than the bias voltage $V_b$ at a high temperature (e.g., 150° C.) That is, $V_b$ at a low temperature>$V_b$ at a high temperature.

The bias control circuit 104 improves a read margin of the ROM cells 102. The read margin of a ROM cell is defined as a time duration that is required to read each data bit stored in the corresponding ROM cell. The read margin determines stability (i.e., accuracy) of the read operations of the ROM cells 102.

The first and second precharge circuits 106a and 106b are connected to the first and second sets of bit lines FSBL and SSBL, respectively. The first and second precharge circuits 106a and 106b precharge the first and second sets of bit lines FSBL and SSBL to a voltage level of a supply voltage VDD, respectively, during the read operations of the ROM cells 102.

The first and second sets of word lines FSWL and SSWL are connected to the first and second decoders for receiving the first and second sets of word line voltages, respectively. During the read operations of the first and second ROM cells 102$a$ and 102$b$, a word line of the first set of word lines FSWL is asserted or de-asserted. Similarly, during the read operations of the third and fourth ROM cells 102$c$ and 102$d$, a word line of the second set of word lines SSWL is asserted or de-asserted. When the word line is asserted, the corresponding word line voltage is high and the word line voltages of the remaining word lines are low. Similarly, when the word line is de-asserted, the corresponding word line voltage is low and the word line voltages of the remaining word lines are high. The high voltage level corresponds to the voltage level of the supply voltage VDD, and the low voltage level corresponds to ground.

The first and second sets of bit lines FSBL and SSBL are precharged to the voltage level of the supply voltage VDD, during the read operations of the ROM cells 102. The first and second sets of bit lines FSBL and SSBL read the data stored in the ROM cells 102, in conjunction with the first and second sets of word lines FSWL and SSWL.

Although the present invention describes the ROM circuit 100 including the first through fourth ROM cells 102$a$-102$d$, it will be apparent to a person skilled in the art that the scope of the present invention is not limited to it. In various other embodiments of the present invention, the ROM circuit 100 may include more than four ROM cells, without deviating from the scope of the present invention. Consequently, the ROM circuit 100 may include more than two sets of word lines, more than two sets of bit lines, and more than two precharge circuits, without deviating from the scope of the present invention.

Figure 2A:
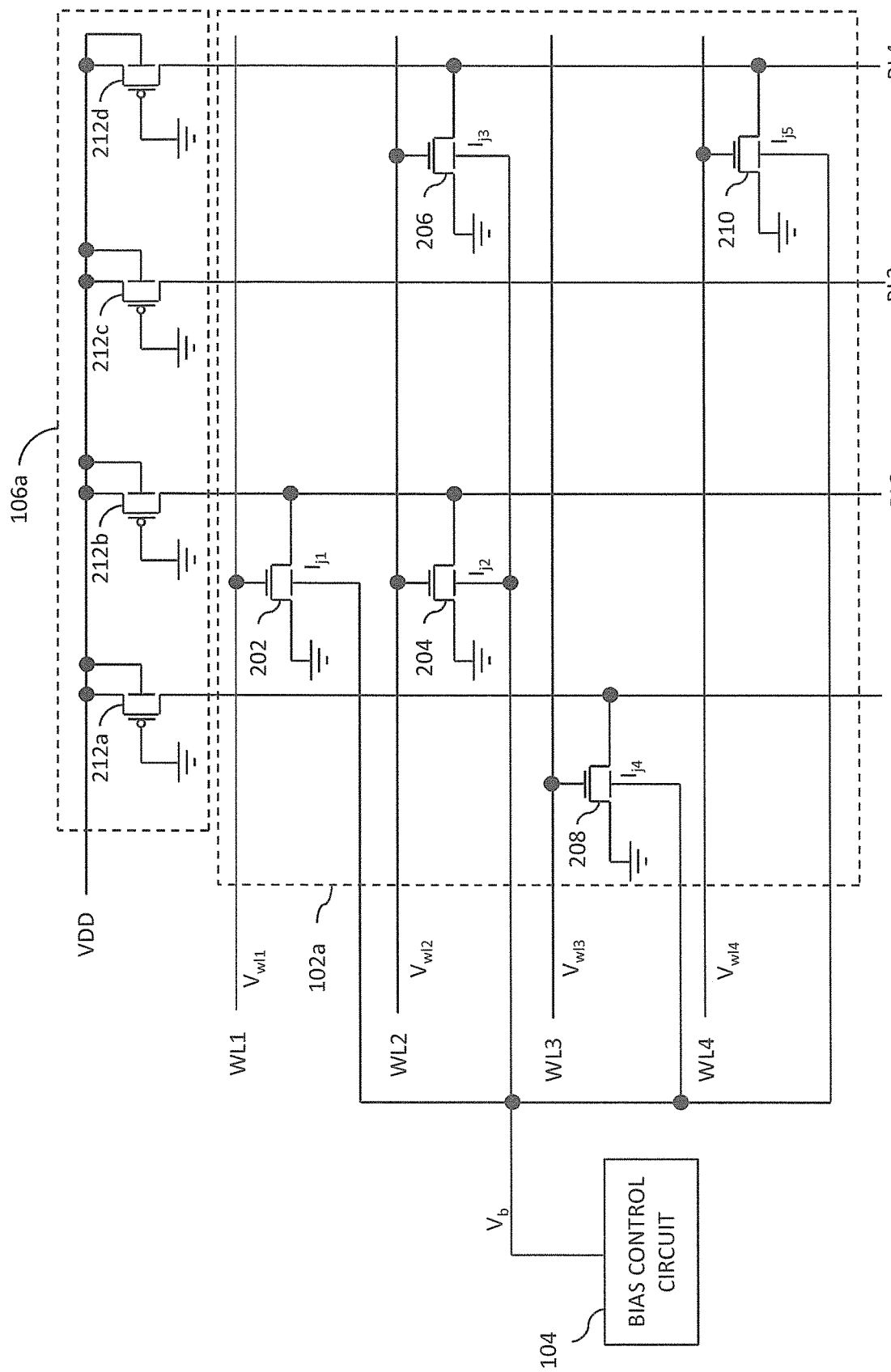
FIG. 2A is a schematic circuit diagram of a first ROM cell of the ROM circuit of FIG. 1 and a first precharge circuit of the ROM circuit of FIG. 1 in accordance with an embodiment of the present invention.

Referring now to FIG. 2A, a schematic circuit diagram of the first ROM cell 102$a$ and the first precharge circuit 106$a$ in accordance with an embodiment of the present invention is shown. The first ROM cell 102$a$ is connected to the first set of word lines FSWL and the first set of bit lines FSBL. The first set of word lines FSWL includes first through fourth word lines WL1-WL4 that provide first through fourth word line voltages $V_{w11}$-$V_{w14}$, respectively. The first set of bit lines FSBL includes first through fourth bit lines BL1-BL4. The first ROM cell 102$a$ includes the first set of transistors, where the first set of transistors includes first through fifth transistors 202-210. The first precharge circuit 106$a$ includes first through fourth precharge transistors 212$a$-212$d$.

The first transistor 202 has a gate terminal connected to the first word line WL1 for receiving the first word line voltage $V_{w11}$, a drain terminal connected to the second bit line BL2, and a source terminal connected to ground. Similarly, the second and third transistors 204 and 206 have their gate terminals connected to the second word line WL2 for receiving the second word line voltage $V_{w12}$, and source terminals connected to ground. Further, drain terminals of the second and third transistors 204 and 206 are connected to the second and fourth bit lines BL2 and BL4, respectively. Body terminals of the second and third transistors 204 and 206 are connected to a body terminal of the first transistor 202.

The fourth transistor 208 has a gate terminal connected to the third word line WL3 for receiving the third word line voltage $V_{w13}$, a drain terminal connected to the first bit line BL1, and a source terminal connected to ground. Similarly, the fifth transistor 210 has a gate terminal connected to the fourth word line WL4 for receiving the fourth word line voltage $V_{w14}$, a drain terminal connected to the fourth bit line BL4, and a source terminal connected to ground. Body terminals of the fourth and fifth transistors 208 and 210 are connected to the body terminals of the first through third transistors 202-206. The first through fifth transistors 202-210 are NMOS transistors. Further, it will be apparent to a person skilled in the art that the arrangement of the first through fifth transistors 202-210 (as illustrated in FIG. 2A) corresponds to the NOR ROM configuration. Thus, the first ROM cell 102$a$ is a NMOS based NOR ROM cell.

The bias control circuit 104 is connected to the body terminals of the first through fifth transistors 202-210 (hereinafter referred to as the "transistors 202-210") to receive the leakage currents $I_{j1}$-$I_{j5}$, respectively. The leakage currents $I_{j1}$-$I_{j5}$ correspond to the junction leakages generated at the body terminals of the transistors 202-210, respectively. It is noted that the accumulation of junction leakages creates junction voltages ($V_{j1}$-$V_{j5}$). Based on the junction leakages, the bias control circuit 104 generates the bias voltage $V_b$. Further, the bias control circuit 104 provides the bias voltage $V_b$ to the body terminals of the transistors 202-210 to control threshold voltages of the corresponding transistors. A threshold voltage of a transistor is a voltage at which the transistor is activated.

When the bias voltage $V_b$ increases, the threshold voltages of the transistors 202-210 decrease, thereby increasing drive strengths of the corresponding transistors. When the bias voltage $V_b$ decreases, the threshold voltages of the transistors 202-210 increase, thereby decreasing the drive strengths of the corresponding transistors.

The bias voltage $V_b$ is temperature-dependent. For high temperatures (such as 100° C. to 150° C.), the bias voltage $V_b$ is at a first voltage level and for low temperatures (such as −50° C. to −10° C.), the bias voltage $V_b$ is at a second voltage level that is higher than the first voltage level. In one embodiment, the first voltage level is approximately equal to ground, and the second voltage level is significantly greater than ground (i.e., in a range of 100 millivolts (mV) to 250 mV). Thus, an increase in the drive strengths of the transistors 202-210 at the first voltage level of the bias voltage $V_b$ is less than the increase in the drive strengths of the transistors 202-210 at the second voltage level of the bias voltage $V_b$.

The first through fourth precharge transistors 212$a$-212$d$ have their gate terminals connected to ground, and source and body terminals connected to a power supply (not shown) for receiving the supply voltage VDD. Further, drain terminals of the first through fourth precharge transistors 212$a$-212$d$ are connected to the first through fourth bit lines BL1-BL4, respectively. The first through fourth precharge transistors 212$a$-212$d$ precharge the first through fourth bit lines BL1-BL4 to the voltage level of the supply voltage VDD, respectively. In one embodiment, the first through fourth precharge transistors 212$a$-212$d$ are PMOS transistors.

The first through fourth bit lines BL1-BL4 are connected to first through fourth sense amplifiers (not shown), respectively. The first through fourth sense amplifiers sense changes in the voltage levels of the first through fourth bit lines BL1-BL4, respectively. Based on the sensed changes in the voltage levels, the first through fourth sense amplifiers output first through fourth outputs bits (not shown), respectively. The first through fourth output bits are indicative of the data stored in the first ROM cell 102$a$ (i.e., the first data).

In one embodiment, the first through fourth sense amplifiers are complementary metal oxide semiconductor (CMOS) inverters.

During the read operation of the first ROM cell 102a, the first through fourth bit lines BL1-BL4 are precharged to the voltage level of the supply voltage VDD. When one of the first through fourth word lines WL1-WL4 is asserted, the corresponding word line is high and the remaining word lines are low. Thus, when the first word line WL1 is asserted, the first transistor 202 is activated, and the second through fifth transistors 204-210 are deactivated. Hence, a voltage level of the second bit line BL2 decreases (i.e., the second bit line BL2 discharges by way of the first transistor 202). Further, the voltage levels of the first, third, and fourth bit lines BL1, BL3 and BL4 are unchanged. In one embodiment, as the voltage level of the second bit line BL2 decreases, the second sense amplifier outputs a logical '1' as the second output bit. Further, as the voltage levels of the first, third, and fourth bit lines BL1, BL3 and BL4 are unchanged, the first, third, and fourth sense amplifiers output logical '0's as the first, third, and fourth output bits, respectively. Similarly, when the second, third, or fourth word line WL2, WL3, or WL4 is asserted, the first through fourth sense amplifiers output the corresponding first through fourth output bits based on the changes in the voltage levels of the first through fourth bit lines BL1-BL4. It will be apparent to a person skilled in the art that the read operation of the first ROM cell 102a is similar to a read operation of a conventional NMOS based NOR ROM cell.

At low temperatures, the bias voltage $V_b$ is at the second voltage level. Receiving the bias voltage $V_b$ at the second voltage level ensures that the threshold voltages of the transistors 202-210 at low temperatures are less than the threshold voltages at high temperatures. Reduction in the threshold voltages of the transistors 202-210 at low temperatures ensures that the read margin at low temperatures is above an acceptable level. The acceptable level of the read margin indicates that there are no data upsets when the data is read from the first ROM cell 102a. Thus, the data stored in the first ROM cell 102a (i.e., the first data) is accurately read during the read operation of the first ROM cell 102a at low temperatures.

At high temperatures, the bias voltage $V_b$ is at the first voltage level. As the first voltage level is approximately equal to ground, the read margin of the first ROM cell 102a is above the acceptable level at high temperatures. Thus, the data stored in the first ROM cell 102a (i.e., the first data) is accurately read during the read operation of the first ROM cell 102a at high temperatures.

Figure 2B:
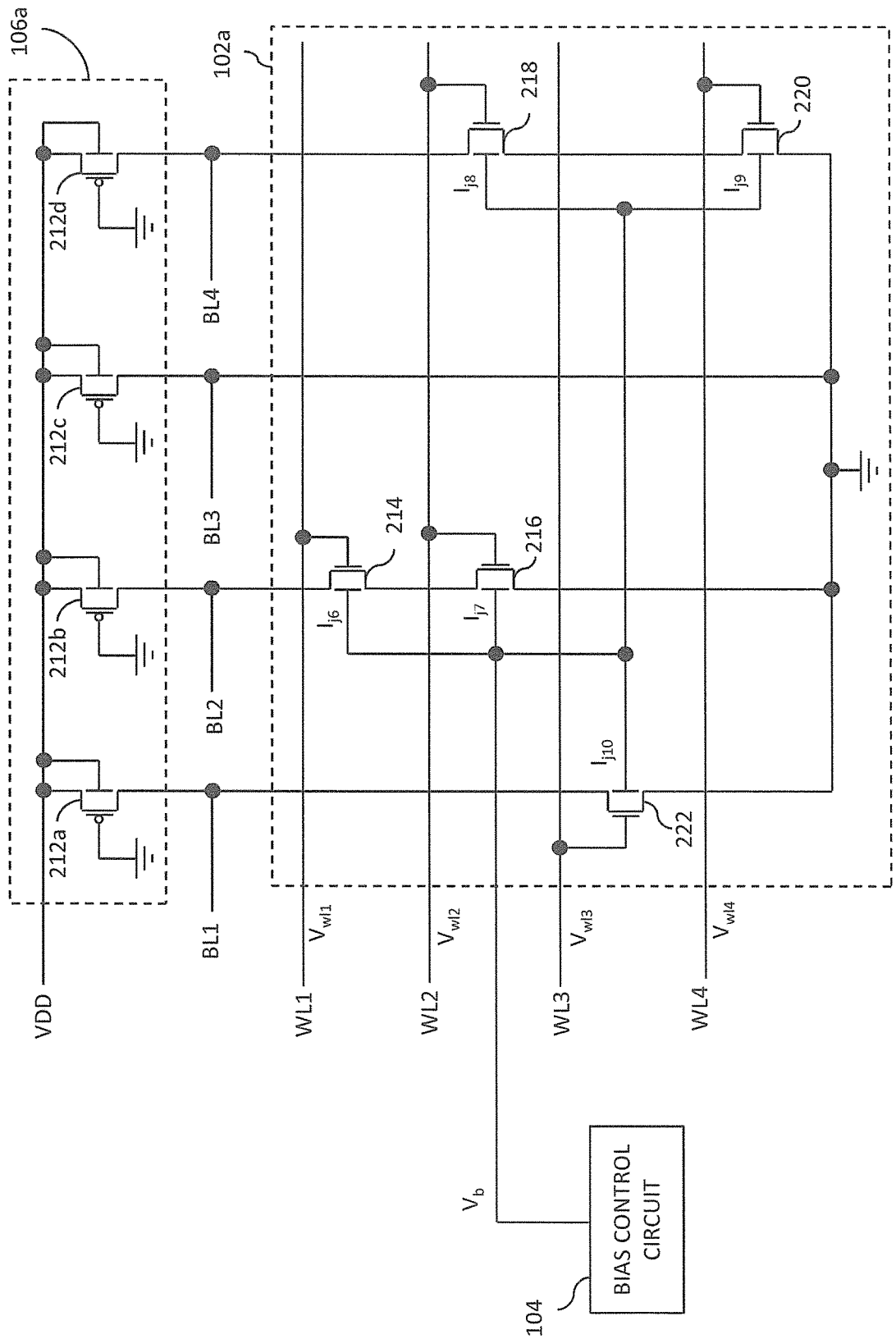
FIG. 2B is a schematic circuit diagram of the first ROM cell and the first precharge circuit in accordance with another embodiment of the present invention.

Referring now to FIG. 2B, a schematic circuit diagram of the first ROM cell 102a and the first precharge circuit 106a in accordance with another embodiment of the present invention is shown. The operation of the first precharge circuit 106a is the same as described above with reference to FIG. 2A. The difference between the embodiments of FIGS. 2A and 2B is in the first ROM cell 102a.

The first ROM cell 102a includes the first set of transistors, where the first set of transistors includes sixth through tenth transistors 214-222. The sixth transistor 214 has a gate terminal connected to the first word line WL1 for receiving the first word line voltage $V_{w11}$, and a drain terminal connected to the second bit line BL2. The seventh transistor 216 has a gate terminal connected to the second word line WL2 for receiving the second word line voltage $V_{w12}$, and a source terminal connected to ground. Drain and body terminals of the seventh transistor 216 are connected to source and body terminals of the sixth transistor 214, respectively. Similarly, the eighth transistor 218 has a gate terminal connected to the second word line WL2 for receiving the second word line voltage $V_{w12}$, and a drain terminal connected to the fourth bit line BL4. The ninth transistor 220 has a gate terminal connected to the fourth word line WL4 for receiving the fourth word line voltage $V_{w14}$, a source terminal connected to ground, and a drain terminal connected to a source terminal of the eighth transistor 218. Body terminals of the eighth and ninth transistors 218 and 220 are connected to the body terminals of the sixth and seventh transistors 214 and 216.

The tenth transistor 222 has a gate terminal connected to the third word line WL3 for receiving the third word line voltage $V_{w13}$, a source terminal connected to ground, and a drain terminal connected to the first bit line BL1. The tenth transistor 222 further has a body terminal connected to the body terminals of the sixth through ninth transistors 214-220. The sixth through tenth transistors 214-222 are NMOS transistors. Further, it will be apparent to a person skilled in the art that the arrangement of the sixth through tenth transistors 214-222 (as illustrated in FIG. 2B) corresponds to the NAND ROM configuration. Thus, the first ROM cell 102a is a NMOS based NAND ROM cell.

The bias control circuit 104 is connected to the body terminals of the sixth through tenth transistors 214-222 (hereinafter referred to as the "transistors 214-222") to receive the leakage currents $I_{j6}$-$I_{j10}$, respectively. Based on the leakage currents $I_{j6}$-$I_{j10}$, the bias control circuit 104 generates the bias voltage $V_b$. Further, the bias control circuit 104 provides the bias voltage $V_b$ to the body terminals of the transistors 214-222 to control threshold voltages of the corresponding transistors.

During the read operation of the first ROM cell 102a, the first through fourth bit lines BL1-BL4 are precharged to the voltage level of the supply voltage VDD. Additionally, the first through fourth word lines WL1-WL4 are precharged to the voltage level of the supply voltage VDD. When one of the first through fourth word lines WL1-WL4 is de-asserted, the corresponding word line is low and the remaining word lines are high. Thus, when the first word line WL1 is de-asserted, the sixth transistor 214 is deactivated, and the second through fifth transistors 216-222 are activated. Hence, the voltage level of the second bit line BL2 is unchanged, and the voltage levels of the first, third, and fourth bit lines BL1, BL3 and BL4 decrease. In one embodiment, as the voltage level of the second bit line BL2 is unchanged, a logical '1' is output as the second output bit. Further, as the voltage levels of the first, third, and fourth bit lines BL1, BL3 and BL4 decrease, logical '0's are output as the first, third, and fourth output bits, respectively. Similarly, when the second, third, or fourth word line WL2, WL3, or WL4 is de-asserted, the corresponding first through fourth output bits are output based on the changes in the voltage levels of the first through fourth bit lines BL1-BL4. It will be apparent to a person skilled in the art that the read operation of the first ROM cell 102a is similar to a read operation of a conventional NMOS based NAND ROM cell.

Figure 3C:
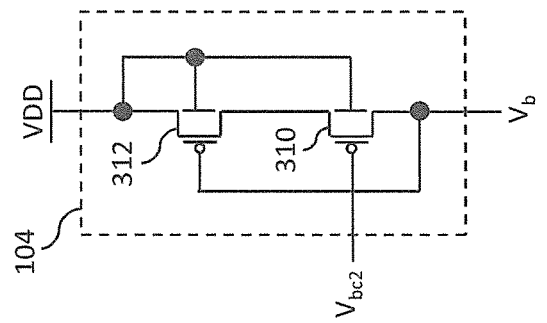
FIG. 3C is a schematic circuit diagram of another alternative embodiment of the bias control circuit.
Figure 3D:
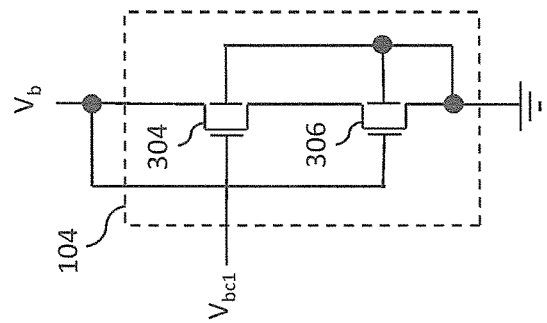
FIG. 3D is a schematic circuit diagram of yet another embodiment of the bias control circuit.
Figure 3A:
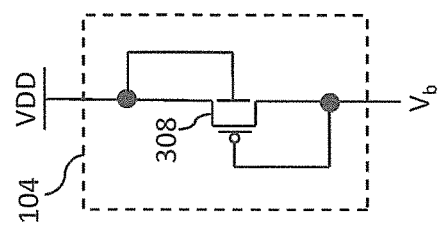
FIG. 3A is a schematic circuit diagram of a bias control circuit of the ROM circuit of FIG. 1 in accordance with an embodiment of the present invention.

Referring now to FIG. 3A, a schematic circuit diagram of the bias control circuit 104 in accordance with an embodiment of the present invention is shown. The bias control circuit 104 includes a first NMOS transistor 302. The first NMOS transistor 302 is a diode-connected transistor. The first NMOS transistor 302 has source and body terminals connected to ground, and drain and gate terminals connected to the body terminals of the first set of transistors of the first ROM cell 102a (i.e., the transistors 202-210 or the transistors 214-222). The bias control circuit 104 of FIG. 3A generates the bias voltage $V_b$ to bias a NMOS based ROM cell (such as the first ROM cell 102a as shown in FIGS. 2A and 2B).

Figure 3B:
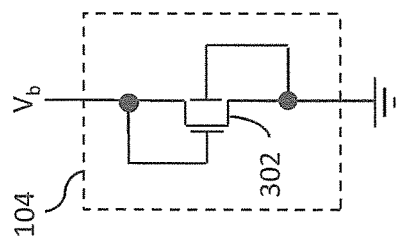
FIG. 3B is a schematic circuit diagram of an alternative embodiment of the bias control circuit.

Referring now to FIG. 3B, a schematic circuit diagram of the bias control circuit 104 in accordance with another embodiment of the present invention is shown. The bias control circuit 104 includes second and third NMOS transistors 304 and 306. The second NMOS transistor 304 has a drain terminal connected to the body terminals of the first set of transistors of the first ROM cell 102a (i.e., the transistors 202-210 or the transistors 214-222). The second NMOS transistor 304 further has a gate terminal connected to a first bias control generator (not shown) for receiving a first bias control voltage $V_{bc1}$, and a body terminal connected to a body terminal of the third NMOS transistor 306 and to ground. The second NMOS transistor 304 is controlled by way of the first bias control voltage $V_{bc1}$.

The third NMOS transistor 306 has a drain terminal connected to a source terminal of the second NMOS transistor 304, a gate terminal connected to the drain terminal of the second NMOS transistor 304, and source and body terminals connected to ground. In one embodiment, a voltage level of the first bias control voltage $V_{bc1}$ is such that the second PMOS transistor 310 is activated, and thus the second and third NMOS transistors 304 and 306 form diode-connected transistors. The bias control circuit 104 of FIG. 3B generates the bias voltage $V_b$ to bias a NMOS based ROM cell (such as the first ROM cell 102a as shown in FIGS. 2A and 2B).

Referring now to FIG. 3C, a schematic circuit diagram of the bias control circuit 104 in accordance with another embodiment of the present invention is shown. The bias control circuit 104 includes a first PMOS transistor 308. The first PMOS transistor 308 is a diode-connected transistor. The first PMOS transistor 308 has source and body terminals connected to the power supply for receiving the supply voltage VDD. The first PMOS transistor 308 further has drain and gate terminals connected to the body terminals of the first set of transistors of the first ROM cell 102a (i.e., the transistors 202-210 or the transistors 214-222). The bias control circuit 104 of FIG. 3C generates the bias voltage $V_b$ to bias a PMOS based ROM cell.

Referring now to FIG. 3D, a schematic circuit diagram of the bias control circuit 104 in accordance with yet another embodiment of the present invention is shown. The bias control circuit 104 includes second and third PMOS transistors 310 and 312. The second PMOS transistor 310 has a drain terminal connected to the body terminals of the first set of transistors of the first ROM cell 102a (i.e., the transistors 202-210 or the transistors 214-222). The second PMOS transistor 310 further has a gate terminal connected to a second bias control generator (not shown) for receiving a second bias control voltage $V_{bc2}$. The second PMOS transistor 310 is controlled by way of the second bias control voltage $V_{bc2}$. Further, a body terminal of the second PMOS transistor 310 is connected to the power supply for receiving the supply voltage VDD.

The third PMOS transistor 312 has a drain terminal connected to a source terminal of the second PMOS transistor 310, and a gate terminal connected to the drain terminal of the second PMOS transistor 310. The third PMOS transistor 312 further has source and body terminals connected to the body terminal of the second PMOS transistor 310 and to the power supply for receiving the supply voltage VDD. In one embodiment, a voltage level of the second bias control voltage $V_{bc2}$ is such that the second PMOS transistor 310 is activated, and thus the second and third PMOS transistors 310 and 312 form diode-connected transistors. The bias control circuit 104 of FIG. 3D generates the bias voltage $V_b$ to bias a PMOS based ROM cell.

It will be apparent to a person skilled in the art that examples of bias control circuits are not limited to the bias control circuit 104 of FIGS. 3A-3D that include one NMOS transistor, two NMOS transistors, one PMOS transistor, and two PMOS transistors. That is, the bias control circuit 104 may include any number of NMOS or PMOS transistors without deviating from the scope of the present invention.

Figure 4:
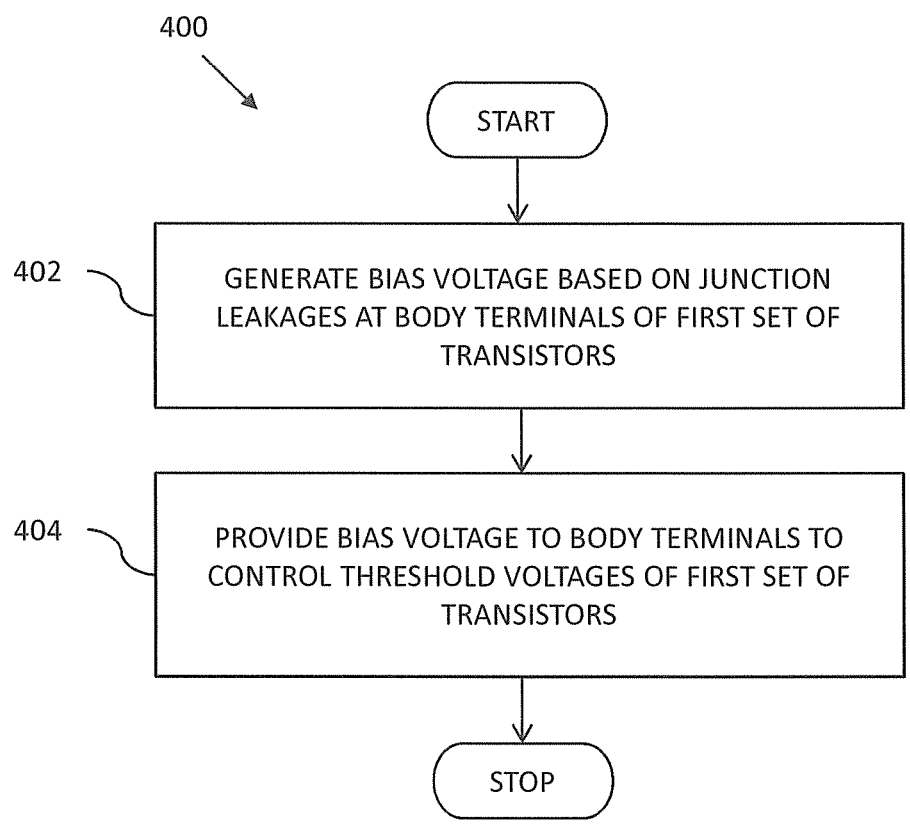
FIG. 4 is a flow chart illustrating a method for biasing the first ROM cell in accordance with an embodiment of the present invention.

Referring now to FIG. 4, a flow chart 400 illustrating a method for biasing the first ROM cell 102a in accordance with an embodiment of the present invention is shown. At step 402, the bias control circuit 104 generates the bias voltage $V_b$ based on the junction leakages at the body terminals of the first set of transistors (i.e., the transistors 202-210 or the transistors 214-222). At step 404, the bias control circuit 104 provides the bias voltage $V_b$ to the body terminals of the first set of transistors to control the threshold voltages of the corresponding transistors.

The bias control circuit 104 regulates the read margin of the ROM cells 102 by controlling the threshold voltages of the first through fourth sets of the transistors, respectively. The use of the bias voltage $V_b$ to bias the body terminals of the first through fourth sets of transistors ensures that the read margin of the ROM cells 102 is constant and above acceptable levels over a wide temperature range. This increases the accuracy of the read operations. Further, the read margin of the ROM cells 102 is greater than the read margin of conventional ROM cells, especially at low temperatures and at low operating voltages (e.g., 0.8 volts at 40 nanometer technology node) of the ROM cells 102. As the bias voltage $V_b$ is temperature-dependent, reducing the threshold voltages of the first through fourth sets of the transistors at low temperatures does not result in reduction in the threshold voltages of the first through fourth sets of the transistors at high temperatures. Thus, an improvement in the read margin at low temperatures does not increase static leakage power of the ROM cells 102 at high temperatures.

The bias control circuit 104 further regulates read currents and operational speeds of the ROM cells 102 by controlling the threshold voltages of the first through fourth sets of the transistors, respectively. The bias voltage $V_b$ at the second voltage level at low temperatures ensures that the drive strengths of the first through fourth sets of the transistors are greater than drive strengths of transistors of conventional ROM cells, especially at the low operating voltages. This ensures that the read currents of the ROM cells 102 are greater than read currents of conventional ROM cells, especially at low temperatures and low operating voltages. Hence, the operational speeds of the ROM cells 102 are greater than operational speeds of conventional ROM cells, especially at low temperatures and low operating voltages. The improvement in the read currents may also result in reduction in operating voltages of the ROM cells 102.

The voltage levels of the bias voltage $V_b$ vary very little over various process corners. Hence, the bias control circuit 104 may be used to generate the bias voltage $V_b$ for various process corners such as a fast or slow NMOS and fast PMOS transistor process corners, fast NMOS and slow PMOS transistors process corner, and a slow NMOS and fast PMOS transistors process corner.

The use of a transistor-based diode as a biasing circuit to generate the bias voltage $V_b$ ensures that the bias control circuit 104 occupies less area than conventional biasing circuits that include various combinations of transistors, resistors, diodes, and the like. Thus, the area occupied by the ROM circuit 100 on an integrated circuit (IC) is less than the area occupied by ROM circuits that include conventional biasing circuits. Further, the power consumed by the ROM circuit 100 is less than the power consumed by conventional ROM circuits. Hence, the static leakage power of the ROM circuit 100 is less than static leakage power of the conventional ROM circuits, especially at high temperatures.

It will be understood by those of skill in the art that the same functions may be performed by different arrangements of transistors that may operate using either high active or low active signals. Therefore, variations in the arrangement of some of the transistors described above should not be considered to depart from the scope of the present invention. No element, act, or instruction used in the present application should be construed as critical or essential to the invention unless explicitly described as such. Further, the phrase "based on" is intended to mean "based, at least in part, on" unless explicitly stated otherwise. Also, in describing transistors, the terms gate, source and drain are used interchangeably with the terms gate terminal, source terminal and drain terminal.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A read-only memory (ROM) circuit, comprising:
a plurality of memory cells, wherein each memory cell includes a transistor, each transistor having a gate terminal connected to a word line, one of a drain terminal or a source terminal connected to a bit line, another one of the drain terminal or the source terminal connected to ground, and a body terminal; and
a bias control circuit for biasing the plurality of memory cells, wherein the bias control circuit is connected to the body terminal of the transistor of each memory cell of the plurality of memory cells of each memory cell for providing a bias voltage to control threshold voltages of each of the transistors, wherein the bias control circuit receives leakage currents generated at the body terminals and the bias voltage is generated based on the junction leakages at the body terminals, and wherein the bias voltage is temperature-dependent.

2. The ROM circuit of claim 1, wherein the bias control circuit includes a first transistor having source and body terminals connected to ground, and drain and gate terminals connected to the body terminals of each of the transistors for providing the bias voltage.

3. The ROM circuit of claim 1, wherein the bias control circuit includes:
a second transistor having a drain terminal connected to the body terminal of each of the transistors for providing the bias voltage thereto, a gate terminal that receives the bias voltage, and a body terminal connected to ground; and
a third transistor having a drain terminal connected to a source terminal of the second transistor, a gate terminal connected to the drain terminal of the second transistor, and source and body terminals connected to ground.

4. The ROM circuit of claim 1, wherein the bias control circuit includes a fourth transistor having source and body terminals that receive a supply voltage, and drain and gate terminals connected to the body terminals of each of the transistors for providing the bias voltage.

5. The ROM circuit of claim 1, wherein the bias control circuit includes:
a fifth transistor having a drain terminal connected to the body terminals of each of the transistors for providing the bias voltage thereto, a gate terminal that receives the bias voltage, and a body terminal that receives a supply voltage; and
a sixth transistor having a drain terminal connected to a source terminal of the fifth transistor, a gate terminal connected to the drain terminal of the fifth transistor, and source and body terminals that receive the supply voltage.

6. The ROM circuit of claim 1, wherein the bias voltage is higher for a first temperature than a second temperature, and wherein the first temperature is less than the second temperature.

7. The ROM circuit of claim 1, wherein the bias control circuit regulates a read margin and an operational speed of each memory cell of the plurality of memory cells by controlling the corresponding threshold voltages.

8. A read-only memory (ROM) circuit, comprising:
a ROM array having a set of transistors;
a bias control circuit for biasing the ROM array, wherein the bias control circuit is connected to body terminals of the set of transistors for providing a bias voltage to control threshold voltages of the set of transistors, wherein the bias voltage is generated based on junction leakages at the body terminals, and wherein the bias voltage is temperature-dependent;
a set of word lines connected to the ROM array, wherein the set of word lines provides a set of word line voltages to the ROM cell for controlling an operation of the ROM array, and wherein a gate terminal of each transistor of the set of transistors is connected to a word line of the set of word lines; and
a set of bit lines connected to the ROM array, wherein data stored in the ROM array is read by way of the set of bit lines, and wherein the data is read based on the set of word line voltages.

9. The ROM circuit of claim 8, wherein the bias control circuit includes a first transistor having source and body terminals connected to ground, and drain and gate terminals connected to the body terminals of the set of transistors for providing the bias voltage.

10. The ROM circuit of claim 8, wherein the bias control circuit includes:
a second transistor having a drain terminal connected to the body terminals of the set of transistors for providing the bias voltage thereto, a gate terminal that receives the bias voltage, and a body terminal connected to ground; and
a third transistor having a drain terminal connected to a source terminal of the second transistor, a gate terminal connected to the drain terminal of the second transistor, and source and body terminals connected to ground.

11. The ROM circuit of claim 8, wherein the bias control circuit includes a fourth transistor having source and body terminals that receive a supply voltage, and drain and gate terminals connected to the body terminals of the set of transistors for providing the bias voltage.

12. The ROM circuit of claim 8, wherein the bias control circuit includes:
a fifth transistor having a drain terminal connected to the body terminals of the set of transistors for providing the bias voltage thereto, a gate terminal that receives the bias voltage, and a body terminal that receives a supply voltage; and a sixth transistor having a drain terminal connected to a source terminal of the fifth transistor, a gate terminal connected to the drain terminal of the fifth transistor, and source and body terminals that receive the supply voltage.

13. The ROM circuit of claim 8, wherein the bias control circuit regulates a read margin and an operational speed of the ROM array by controlling the threshold voltages.

14. A method for biasing a read-only memory (ROM) array having a plurality of memory cells, each of the plurality of memory cells including a transistor, each transistor having a gate terminal connected to a word line, one of a drain terminal or a source terminal connected to a bit line, another one of the drain terminal or the source terminal connected to ground, and a body terminal, the method comprising:
   generating, by a bias control circuit, a bias voltage based on junction leakages at the body terminal of each of the transistors of the ROM array, wherein the bias voltage is temperature-dependent; and
   providing, by the bias control circuit, the bias voltage to the body terminals of each of the transistors for controlling threshold voltages of the set of transistors.

15. The method of claim 14, wherein the bias control circuit regulates a read margin and an operational speed of the ROM array by controlling the threshold voltages.

16. The method of claim 14, wherein the bias control circuit includes a first transistor having source and body terminals connected to ground, and drain and gate terminals connected to the body terminals of the transistors of the plurality of memory cells.

17. The method of claim 14, wherein the bias control circuit includes:
   a second transistor having a drain terminal connected to the body terminals of the set of transistors, a gate terminal for receiving the bias voltage, and a body terminal connected to ground; and
   a third transistor having a drain terminal connected to a source terminal of the second transistor, a gate terminal connected to the drain terminal of the second transistor, and source and body terminals connected to ground.

18. The method of claim 14, wherein the bias control circuit includes a fourth transistor having source and body terminals that receive a supply voltage, and drain and gate terminals connected to the body terminal of each of the transistors for providing the bias voltage.

19. The method of claim 14, wherein the bias control circuit includes:
   a fifth transistor having a drain terminal connected to the body terminal of each of the transistors for providing the bias voltage thereto, a gate terminal that receives a bias control voltage, and a body terminal that receives a supply voltage; and
   a sixth transistor having a drain terminal connected to a source terminal of the fifth transistor, a gate terminal connected to the drain terminal of the fifth transistor, and source and body terminals that receive the supply voltage.

* * * * *